United States Patent [19]

Ribes et al.

[11] Patent Number: 5,851,954
[45] Date of Patent: Dec. 22, 1998

[54] SUPERCONDUCTING OXIDE-BASED COMPOSITE MATERIAL

[75] Inventors: Michel Ribes, Clapiers; Christian Belouet, Sceaux, both of France

[73] Assignee: Alcatel Alsthom Compagnie Generale D'Electricite, Paris, France

[21] Appl. No.: 816,715

[22] Filed: Jan. 3, 1992

[30] Foreign Application Priority Data

Jan. 4, 1991 [FR] France ................................. 91 00072

[51] Int. Cl.⁶ .................................................... H01B 12/00
[52] U.S. Cl. ......................... 505/120; 505/121; 505/126; 505/780; 505/782; 505/783
[58] Field of Search ............................. 505/1, 780, 782, 505/783, 785, 120, 121, 126; 427/62; 423/604, 635; 252/521; 501/152

[56] References Cited

U.S. PATENT DOCUMENTS 5,149,687  9/1992  Galasso ....................................... 505/1

FOREIGN PATENT DOCUMENTS 63-310764  12/1988  Japan .
1-219058   9/1989   Japan .

OTHER PUBLICATIONS

Masuda et al, "Glass–Former–Doped Superconductors", Jpn. J. Appl. Phys. Lett. 27(8) Aug. 1988 pp. L1417–L1419.
Qiu et al, "Some properties of bulk Y–Ba–Cu–O compounds containing $SiO_2$", J. Appl. Phys. 64(4) Aug. 1988 pp. 2234–2236.
Yoshitake et al, "Preparation of thin films by Coevaporation and Phase identification in Bi–Sr–Ca–Cu–O system," Jpn. J. Appl. Phys. Lett. 27(6) Jun. 1988, pp. L1089–L1091.
Materials Research Bulletin, vol. 23, No. 5, May 1988, Oxford GB, pp. 623–630; C.W. Nies et al.: "Glass Bonded Composites Containing Superconducting YBA2CU309–y For Levitation And Magnetic Shielding Applications".
Patent Abstracts of Japan, vol. 13, No. 388 (C–630)(3736) Aug. 28, 1989, & JP–A–01 138158 (Matsushita Electric Ind co Ltd) Apr. 21, 1989.
Patent Abstracts of Japan, vol. 13, No. 326 (C–620)(3674) Jul. 24, 1989, & JP–A–01 103934 (Matsushita Electric Ind Co Ltd) Apr. 21, 1989.
Journal of the American Ceramic Society, vol. 73, No. 5, May 1990, Columbus, us, pp. 1165–1171; M.R. De Guire et al: "Superconducting Glass–Ceramics in the BI–SR–CA–CU–O System".
Nippon Seramikkisu Kyokai Gakujutsu Rombushi, vol. 97, No. 2, 1989, Tokyo, Japan, pp. 251–255; T. Komatsu et al.: "Preparation and Properties of Superconducting Glass Ceramics Based on TheBI–SR–CA–CU–O System".

*Primary Examiner*—Roy V. King
*Attorney, Agent, or Firm*—Sughrue, Mion, Zinn, Macpeak & Seas, PLLC

[57] ABSTRACT

A composite based on a superconducting oxide having a high critical temperature, characterized by the fact that it is constituted by glass and said oxide, the glass being such that its vitreous transition temperature is not greater than 750K, the volume fraction of the glass lying in the range 2% to 40%, said oxide existing in the glass in the form of crystallites having substantially the same orientation.

4 Claims, No Drawings

SUPERCONDUCTING OXIDE-BASED COMPOSITE MATERIAL

FIELD OF THE INVENTION

The present invention relates to a composite based on a superconducting oxide having a high critical temperature, and to a method of making it.

BACKGROUND OF THE INVENTION

From the manufacturing point of view, the use of superconducting oxides having a high critical temperature for the purposes of conveying high currents requires two conditions to be satisfied: firstly appropriate shaping, e.g. in the form of tapes or filaments, and secondly a very high degree of texturing of the crystallites. Texturing, as characterized by a common $\vec{c}$ axis for the crystallites is necessary for obtaining the highest possible values of current density $J_c$, including under the influence of a magnetic field.

Unfortunately, the above two conditions are difficult to satisfy simultaneously using conventional methods based on the usual techniques for making ceramics.

The object of the invention is to propose a manufacturing technique specific to such materials.

SUMMARY OF THE INVENTION

The present invention provides a composite based on a superconducting oxide having a high critical temperature, characterized by the fact that it is constituted by glass and said oxide, the glass being such that its vitreous transition temperature is not greater than 750 K, the volume fraction of the glass lying in the range 2% to 40%, said oxide existing in the glass in the form of crystallites having substantially the same orientation.

In particular, the said glass is a glass comprising at least one oxide selected from PbO, $B_2O_3$, $Bi_2O_3$, CaO, $SiO_2$; in which case the glass volume fraction is preferably less than 20%. The glass may also have a formulation close to that of vitrifiable superconducting oxides of the $Bi_2Sr_2CaCu_2O_8$ and $Bi_2Sr_2Ca_2Cu_3O_{10}$ types, in which case the volume fraction of the glass may be as much as 40%.

In a particularly advantageous embodiment, the said superconducting oxide is selected from compounds of $YBa_2Cu_3O_7$, compounds of thallium $Tl_2Ba_2Ca_2Cu_3O_{10}$, and compounds of bismuth of the types $Bi_2Sr_2CaCu_2O_x$ (with x $\approx$ 8), and $Bi_2Sr_2Ca_2Cu_3O_y$ (with y $\approx$ 10), and the derivatives thereof obtained by allowable cation substitutions. The said glass associated with the selected superconductor in the composite then preferably has a formulation substantially identical to that of the oxide.

The present invention also provides a method of manufacturing a composite based on a superconducting oxide, characterized by the fact that:

a powder mixture is made of the superconducting oxide and the glass whose vitreous transition temperature $T_g$ is less than 750 K, with the volume percentage of the glass lying in the range 2% to 40%; and said mixture is compressed uniaxially at a temperature lying in the range $T_g$ to $T_x$, where $T_x$ is the crystallization temperature of the glass.

An additional step of drawing or rolling at a temperature lying between $T_g$ and $T_x$ serves to form the precursor into a filament, a tape, or a block.

DETAILED DESCRIPTION OF THE INVENTION

The nature of a composite of the invention is such that advantage can be taken of the malleability of the glass above its vitreous transition temperature $T_g$ for forming purposes and for orienting its crystallites by uniaxial pressing. In the viscous medium, the plate-shaped crystallites having their $\vec{c}$ axis normal to their main surfaces organize themselves so that their major section is normal to the pressing force.

It is advantageous to use a glass whose vitreous transition temperature is not greater than 700 K since that avoids:

decomposition reactions of superconducting oxides such as $YBa_2Cu_3O_7$ (in particular loss of oxygen); and possible chemical reactions between the glass and the superconducting oxide which would degrade or decompose the superconducting oxide.

In the special case where a composite of the invention is constituted by a glass and an oxide whose cation formulations are identical or very similar, the above-defined method may be continued with heat treatment causing the glass to crystallize. This gives rise to a material that is homogeneous, and constituted solely by the superconductor if the temperature of the heat treatment is close to $T_x$, i.e. about 700 K to 750 K for the above-mentioned bismuth composite.

Other characteristics and advantages of the present invention appear from the following description of an implementation given purely by way of non-limiting illustration.

A superconducting oxide powder of the $Bi_{2-x}Pb_xSr_2Ca_2Cu_3O_{10}$ type (where x is less than 0.5) is mixed with a powder of a glass having an identical cation formulation.

The grain sizes are selected as follows: for the superconductors, in the order of a few micrometers to 100 micrometers; and for the glass in the order of 1 micrometer.

The volume percentage of the glass is about 40%. The two powders are finely mixed using conventional techniques and they are then compacted under dry air by means of uniaxial pressing and at a temperature $T_p$ equal to or slightly greater than the temperature $T_g$ of the glass, but less than the crystallization temperature $T_x$ of the glass.

Pressure of about 1 metric ton per square centimeter (tonne/cm$^2$) is exerted in the pressing mold and a glass-superconducting oxide composite is obtained whose geometrical dimensions are a function of the intended utilization: a block, a filament, or a tape. This constitutes a precursor suitable for being formed at a temperature lying in the range $T_g+(1/3)(T_x-T_g)$ to $T_g+(2/3)(T_x-T_g)$, e.g. by extrusion (for a filament) or by rolling (for a tape).

Taking account of the formulations selected for the two initial powders, additional heat treatment at a temperature close to $T_x$ makes it possible to convert the entire glass into a superconducting material, should that be necessary.

Naturally, the invention is not limited in any way to the implementation described above.

We claim:

1. A superconducting oxide-based composite material produced by a process comprising the steps of:

preparing a powdered mixture of a glass having a vitreous transition temperature $T_g$ of less than 750°K and of superconducting oxide crystallites selected from the group consisting of $YBa_2Cu_3O_7$ compounds, compounds containing $Tl_2Ba_2Cu_3O_{10}$, compounds containing $Bi_2Sr_2 CaCu_2O_8$ and $Bi_2Sr_2Ca_2Cu_3O_{10}$, the percentage of the glass by volume being in the range of 2% to 40%;

uniaxially compressing said powdered mixture at a temperature of $T_g$ and $T_x$, wherein $T_x$ is the glass-crystallization temperature, said compression producing orientation of said superconducting oxide crystallites;

and furthermore subjecting the resulting composite material to an additional stretching or rolling operation at a temperature between $T_g$ and $T_x$, to thereby provide shaping of the composite material.

2. A superconducting oxide-based composite material according to claim 1, wherein said glass is a glass containing an oxide selected from the group consisting of PbO, $B_2O_3$, $Bi_{23}$, CaO, and $SiO_2$, and the proportion of the glass by volume is less than 20%.

3. A superconducting oxide-based composite material according to claim 1, wherein said glass has a formulation approximating that for vitrifiable superconducting oxides containing $Bi_2Sr_2CaCu_2O_8$ and $Bi_2Sr_2CaCu_2O_{10}$;

wherein the stretching or rolling operation is carried out at a temperature between $T_g+\frac{1}{3}(T_x-T_g)$ and $T_g+\frac{2}{3}(T_x-T_g)$.

4. A superconducting oxide-based composite material according to claim 3, wherein in a final operation, said material is subjected to a heat treatment at a temperature of from about 700°K to 750°K in order to crystallize said glass.

* * * * *